United States Patent
Berner et al.

(10) Patent No.: US 12,085,780 B2
(45) Date of Patent: Sep. 10, 2024

(54) OPTICAL SYSTEM, HEATING ARRANGEMENT, AND METHOD FOR HEATING AN OPTICAL ELEMENT IN AN OPTICAL SYSTEM

(71) Applicant: Carl Zeiss SMT GmbH, Oberkochen (DE)

(72) Inventors: Andrea Berner, Jena (DE); Susanne Beder, Aalen (DE); André Dirauf, Aalen (DE); Hans-Michael Stiepan, Aalen (DE); Peter Klopfleisch, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 214 days.

(21) Appl. No.: 17/805,757

(22) Filed: Jun. 7, 2022

(65) Prior Publication Data

US 2022/0299732 A1  Sep. 22, 2022

Related U.S. Application Data (63) Continuation of application No. PCT/EP2020/073207, filed on Aug. 19, 2020.

(30) Foreign Application Priority Data

Dec. 11, 2019  (DE) .......................... 102019219289.0

(51) Int. Cl.
*G02B 7/18* (2021.01)
*G02B 6/10* (2006.01)
(Continued)

(52) U.S. Cl.
CPC ........... *G02B 7/1815* (2013.01); *G02B 6/102* (2013.01); *G02B 6/262* (2013.01);
(Continued)

(58) Field of Classification Search
None
See application file for complete search history.

(56) References Cited

U.S. PATENT DOCUMENTS

| | | | |
|---|---|---|---|
| 9,760,019 B2 * | 9/2017 | Bittner | ................ G03F 7/70266 |
| 2008/0204682 A1 * | 8/2008 | Uehara | ............... G03F 7/70891 |
| | | | 355/77 |

(Continued)

FOREIGN PATENT DOCUMENTS

| | | |
|---|---|---|
| DE | 10 2012 216 284 A1 | 3/2013 |
| DE | 10 2012 213 794 A1 | 2/2014 |

(Continued)

OTHER PUBLICATIONS

Translation of International Search Report for corresponding Appl No. PCT/EP2020/073207, dated Dec. 3, 2020.

(Continued)

*Primary Examiner* — Rhonda S Peace
(74) *Attorney, Agent, or Firm* — Fish & Richardson P.C.

(57) ABSTRACT

An optical system includes at least one optical element which has an optically effective surface and which is designed for an operating wavelength of less than 30 nm. The optical system also includes a heating arrangement for heating this optical element and comprising a plurality of IR emitters for irradiating the optically effective surface with IR radiation. The IR emitters are activatable and deactivatable independently of each other to variably set different heating profiles in the optical element. The optical system further includes at least one beam shaping unit for shaping the beam of the IR radiation steered onto the optically effective surface by the IR emitters. The optical system also includes a multi-fiber head comprising a multi-fiber connector for (Continued)

connecting optical fibers. IR radiation from a respective one of the IR emitters is suppliable by way of each of these optical fibers.

20 Claims, 5 Drawing Sheets (51) Int. Cl.
  G02B 6/26          (2006.01)
  G02B 17/08         (2006.01)
  G03F 7/00          (2006.01)
  H05B 3/84          (2006.01)
  G02B 23/02         (2006.01)
  G02B 27/09         (2006.01)

(52) U.S. Cl.
  CPC ..... *G02B 17/0832* (2013.01); *G03F 7/70891* (2013.01); *H05B 3/84* (2013.01); *G02B 23/02* (2013.01); *G02B 27/0944* (2013.01); *G02B 27/095* (2013.01); *H05B 2203/032* (2013.01)

(56) References Cited

U.S. PATENT DOCUMENTS

| | | |
|---|---|---|
| 2013/0077074 A1 | 3/2013 | Major |
| 2013/0141707 A1 | 6/2013 | Baer |
| 2013/0176544 A1 | 7/2013 | Hauf |
| 2014/0185024 A1 | 7/2014 | Zellner |
| 2016/0041480 A1 | 2/2016 | Hauf |
| 2016/0216616 A1 | 7/2016 | Bittner |
| 2020/0026195 A1 | 1/2020 | Lippert |
| 2021/0041790 A1 | 2/2021 | De Rapper |
| 2022/0299732 A1* | 9/2022 | Berner .................. G02B 6/102 |
| 2024/0069453 A1* | 2/2024 | Beder .................. G02B 27/108 |

FOREIGN PATENT DOCUMENTS

| | | |
|---|---|---|
| DE | 10 2014 212 691 A1 | 8/2014 |
| DE | 10 2013 204 427 A1 | 9/2014 |
| DE | 10 2015 211 167 A1 | 8/2015 |
| DE | 10 2015 201 020 A1 | 7/2016 |
| DE | 10 2015 224 281 A1 | 9/2016 |
| DE | 10 2016 218 746 A1 | 11/2016 |
| DE | 10 2017 207 862 A1 | 7/2017 |
| DE | 10 2016 221 878 A1 | 11/2017 |
| DE | 10 2018 206 404 A1 | 6/2018 |
| DE | 10 2018 208 783 A1 | 7/2018 |
| DE | 10 2017 205 405 A | 10/2018 |
| WO | WO 2014/019870 A1 | 2/2014 |

OTHER PUBLICATIONS

GPTO—Office Action, with translation thereof, for corresponding DE 10 2019 219 289.0, dated Jul. 2, 2020.
Translation of International Preliminary Report for Patentability for corresponding Appl No. PCT/EP2020/073207, dated May 17, 2022.

* cited by examiner

OPTICAL SYSTEM, HEATING ARRANGEMENT, AND METHOD FOR HEATING AN OPTICAL ELEMENT IN AN OPTICAL SYSTEM

CROSS-REFERENCE TO RELATED APPLICATIONS

The present application is a continuation of, and claims benefit under 35 USC 120 to, international application PCT/EP2020/073207, filed Aug. 19, 2020, which claims benefit under 35 USC 119 of German Application No. 10 2019 219 289.0, filed Dec. 11, 2019. The entire disclosure of each of these applications is incorporated by reference herein.

FIELD

The disclosure relates to an optical system and to a heating arrangement and a method for heating an optical element in an optical system, in particular in a microlithographic projection exposure apparatus.

BACKGROUND

Microlithography is used for production of microstructured components, such as integrated circuits or LCDs, for example. The microlithography process is carried out in what is known as a projection exposure apparatus, which includes an illumination device and a projection lens. The image of a mask (=reticle) illuminated via the illumination device is projected here via the projection lens onto a substrate (e.g., a silicon wafer) coated with a light-sensitive layer (photoresist) and arranged in the image plane of the projection lens, in order to transfer the mask structure onto the light-sensitive coating of the substrate.

In projection lenses designed for the EUV range, i.e., at wavelengths of, e.g., approximately 13 nm or approximately 7 nm, mirrors are used as optical components for the imaging process owing to the lack of availability of suitable light-transmissive refractive materials.

As a result of absorption of the radiation emitted by the EUV light source among other reasons, the EUV mirrors can heat up and undergo an associated thermal expansion or deformation, which in turn can negatively affect the imaging properties of the optical system.

Various approaches are known for avoiding surface deformations caused by heat inputs into an EUV mirror and optical aberrations associated therewith.

It is known, inter alia, to use a material with ultra-low thermal expansion ("Ultra Low Expansion Material"), for example a titanium silicate glass sold by Corning Inc. with the name ULE™, as the mirror substrate material and to set what is known as the zero-crossing temperature in a region near the optically effective surface. At this zero-crossing temperature, which lies at around $\vartheta=30°$ C. for example for ULE™, the coefficient of thermal expansion, in its temperature dependence, has a zero crossing in the vicinity of which no thermal expansion or only negligible thermal expansion of the mirror substrate material takes place.

Possible further approaches for avoiding surface deformations caused by heat inputs into an EUV mirror include direct electric heating or else active direct cooling, with such approaches firstly being generally accompanied by increased structural outlay on account of supply lines (e.g., current supplies or cooling-water supplies) and secondly possibly being beset with issues on account of the typically restricted installation space.

A further approach includes the use of a heating arrangement on the basis of infrared radiation. With such a heating arrangement, active mirror heating can take place in phases of comparatively low absorption of EUV used radiation, the active mirror heating being correspondingly decreased as the absorption of the EUV used radiation increases.

However, a further issue that can occur in practice is that of an EUV mirror being exposed to changing intensities of the incident electromagnetic radiation also from a spatial point of view during the operation of the microlithographic projection exposure apparatus, for example on account of the use of illumination settings with an intensity that varies over the optically effective surface of the respective EUV mirror.

Reference is made, merely by way of example, to DE 10 2017 207 862 A1, DE 10 2013 204 427 A1 and DE 10 2017 205 405 A1.

SUMMARY

The present disclosure seeks to provide an optical system, a heating arrangement and a method for heating an optical element in an optical system, such as in a microlithographic projection exposure apparatus, which facilitate an effective avoidance of surface deformations caused by heat inputs into the optical element and optical aberrations accompanying the deformations.

An optical system, such as in a microlithographic projection exposure apparatus, comprises:
- at least one optical element which has an optically effective surface and which is is designed for an operating wavelength of less than 30 nm;
- a heating arrangement for heating this optical element and comprising a plurality of IR emitters for irradiating the optically effective surface with IR radiation, these IR emitters being activatable and deactivatable independently of one another for the purposes of variably setting different heating profiles in the optical element; and
- at least one beam shaping unit for shaping the beam of the IR radiation steered onto the optically effective surface by the IR emitters.

The disclosure involves the concept of avoiding or at least reducing thermally induced deformations of an optical element (in particular of a mirror) in an optical system by virtue of using a heating arrangement based on IR emitters to set a respectively suitable segmented heating profile—which is chosen on the basis of the currently used illumination setting in particular.

The heating arrangement according to the disclosure comprises a plurality of IR emitters that are activatable and deactivatable independently of one another, and also at least one beam shaping unit for shaping the beam of the IR radiation steered from the IR emitters to the optically effective surface. By suitably driving the IR emitters, it is then possible to set a heating profile in the optical element or mirror during the operation of the optical system, the heating profile being suitable for the currently chosen illumination setting.

By way of example, if the illumination setting is a dipole setting with horizontally arranged illumination poles, the heating arrangement according to the disclosure can be used to generate a heating profile that is complementary to this illumination setting or the temperature distribution thereby generated in the optical element (i.e., with irradiation of, inter alia, also the vertically opposing segments) on the optically effective surface on the optical element or mirror in order, as a result, to obtain a temperature distribution of the optical element that is locally as homogeneous as possible and to accordingly effectively avoid thermally induced deformations.

A further feature of the disclosure is that comparatively complicated process steps during the production of the optical element, for instance the attachment of heating wires to which electrical current can be applied, are rendered dispensable.

In embodiments of the disclosure, the beam shaping unit comprises at least one microstructured element, such as at least one diffractive optical element or at least one refractive optical element. However, the disclosure is not restricted thereto, and so a beam shaping unit for example using stops can also be realized in further embodiments.

According to an embodiment, the beam shaping unit comprises a plurality of beam shaping segments for irradiating different segments of the optically effective surface of the optical element with IR radiation. Depending on the specific embodiment of the beam shaping segments, the relevant segments illuminated on the optically effective surface of the optical element may have geometric shapes that differ from one another and may have different dimensions.

For example, each of these beam shaping segments can be assigned to one of the IR emitters in each case. Moreover, the beam shaping segments may alternatively be formed on a plurality of separate elements (such as microstructured elements) or else be formed as separate regions on a common element (such as a common microstructured element).

For example, the beam shaping segments can be different regions on a diffractive optical element (DOE). The flexible and individual adjustment, according to the disclosure, of the respectively set heating profile to the currently used illumination setting can then be implemented in such a way that the IR emitters in each case assigned to certain beam shaping segments on the DOE (for the purposes of irradiating certain segments on the surface of the optical element or mirror) are activated and other IR emitters are deactivated depending on the relevant illumination setting.

According to an embodiment, the optical system comprises a multi-fiber head comprising a multi-fiber connector for connecting optical fibers, IR radiation from a respective one of the IR emitters being suppliable by way of each of these optical fibers.

Inter alia, such an embodiment can be desirable because a comparatively simple adjustment can be facilitated, with the observance of allowed mechanical tolerances in respect of the optical fibers used for the radiation input coupling being able to be ensured at the same time.

According to an embodiment, the at least one beam shaping unit is integrated in the multi-fiber head.

According to an embodiment, the heating arrangement further comprises at least one beam deflection unit between the beam shaping unit and the optical element. By way of such a beam deflection unit (which may be designed as an optical telescope for example) it is possible, for example, to take account of a reduction in the diffraction efficiency of a diffractive optical element, typically to higher diffraction angles, by virtue of relatively large deflection angles being provided by the beam deflection unit and the DOE itself being unburdened, that is to say only having to be operated in an angular range with a sufficiently high diffraction efficiency.

According to an embodiment, the at least one beam deflection unit is integrated in the multi-fiber head.

According to an embodiment, the optical system has a used beam path, the heating arrangement being arranged outside of this used beam path.

According to an embodiment, the optical system further comprises a cooling unit for cooling the heating arrangement, by which additional cooling can be obtained in view of possibly high power densities in the region of the heating arrangement.

According to an embodiment, the optical element is a mirror.

According to an embodiment, the optical element is designed for an operating wavelength of less than 15 nm.

The disclosure further relates to a heating arrangement for heating an optical element, such as for use in an optical system having the above-described features, comprising:
 a plurality of IR emitters for irradiating the optically effective surface of the optical element with IR radiation, these IR emitters being activatable and deactivatable independently of one another for the purposes of variably setting different heating profiles in the optical element, and
 at least one beam shaping unit for shaping the beam of the IR radiation steered onto the optically effective surface by the IR emitters.

The disclosure further also relates to a method for heating an optical element in an optical system, with different heating profiles being set in the optical element using a heating arrangement having the above-described features.

According to an embodiment, the optical element is heated in such a way that a heating profile set via the heating arrangement is chosen on the basis of an illumination setting used in the optical system.

According to an embodiment, the optical element is heated in such a way that a spatial and/or temporal variation of a temperature distribution in the optical element is reduced.

According to an embodiment, the optical element is a mirror.

According to an embodiment, the optical element is designed for an operating wavelength of less than 30 nm, such as less than 15 nm.

With regard to aspects and embodiments of the method, reference is made to the above explanations in association with the heating arrangement according to the disclosure.

Further configurations of the disclosure can be gathered from the description and the dependent claims.

The disclosure is explained in greater detail below on the basis of exemplary embodiments illustrated in the accompanying figures.

BRIEF DESCRIPTION OF THE DRAWINGS

In the figures.

DETAILED DESCRIPTION

Figure 5:
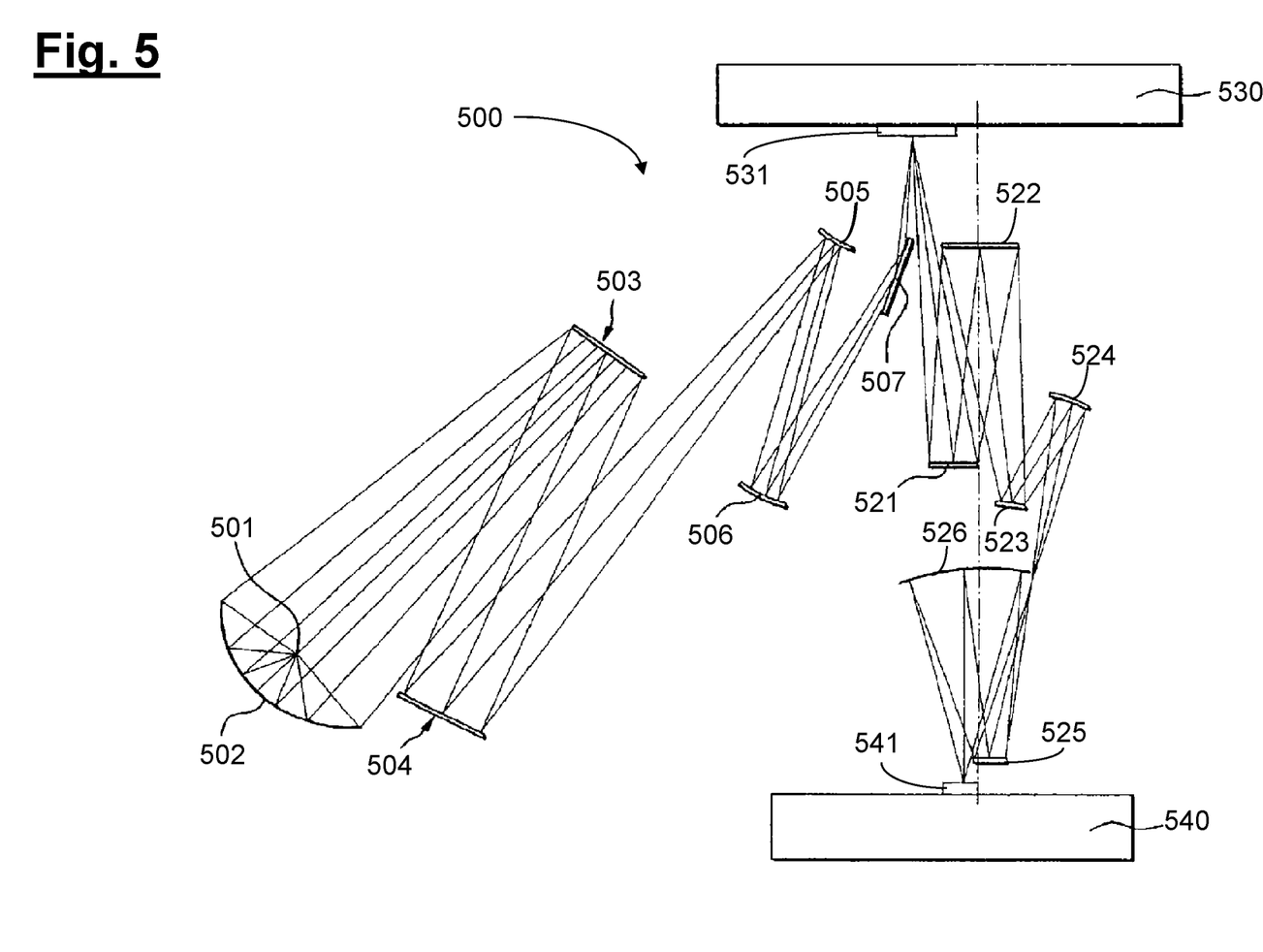
FIG. 5 shows a schematic illustration of the possible structure of a microlithographic projection exposure apparatus designed for operation in the EUV.

FIG. 5 firstly shows a schematic representation of a projection exposure apparatus 500 which is designed for operation in the EUV and in which the disclosure is able to be realized in an exemplary manner.

According to FIG. 5, an illumination device of the projection exposure apparatus 500 comprises a field facet mirror 503 and a pupil facet mirror 504. The light from a light source unit comprising an EUV light source (plasma light source) 501 and a collector mirror 502 in the example is directed onto the field facet mirror 503. A first telescope mirror 505 and a second telescope mirror 506 are arranged in the light path downstream of the pupil facet mirror 504. A deflection mirror 507 is arranged downstream in the light path, the deflection mirror steering the radiation that is incident thereon at an object field in the object plane of a projection lens comprising six mirrors 521-526. At the location of the object field, a reflective structure-bearing mask 531 is arranged on a mask stage 530, the mask being imaged with the aid of the projection lens into an image plane in which a substrate 541 coated with a light-sensitive layer (photoresist) is situated on a wafer stage 540.

During operation of the optical system or microlithographic projection exposure apparatus, the electromagnetic radiation incident on the optically effective surface of the mirrors is partly absorbed and, as explained in the introduction, results in heating and an associated thermal expansion or deformation, which can in turn result in an impairment of the imaging properties of the optical system. The heating arrangement according to the disclosure or the method for heating an optical element can be applied for example to any desired mirror of the microlithographic projection exposure apparatus of FIG. 5.

Figure 1:
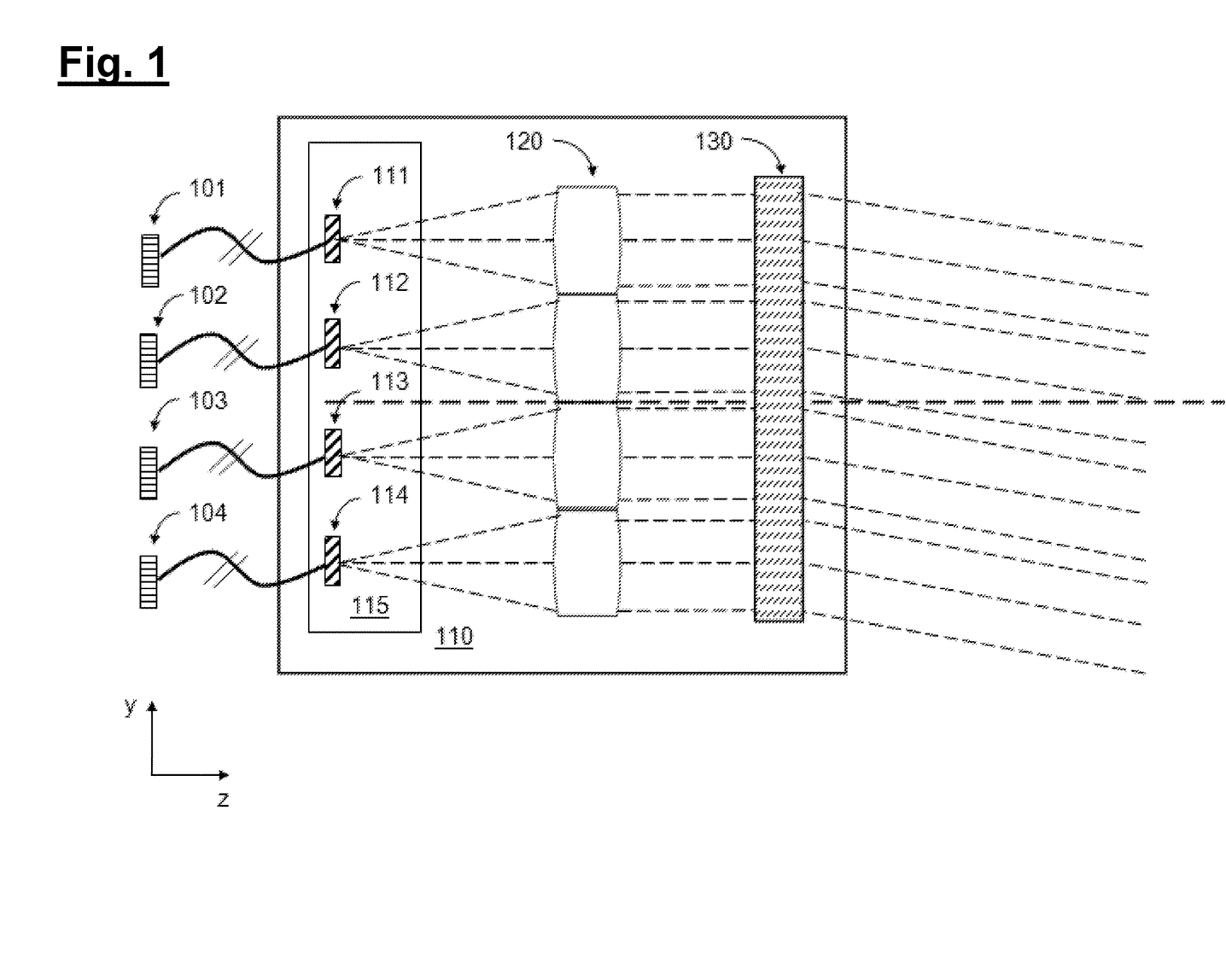
FIG. 1 shows a schematic illustration of a possible structure of a heating arrangement according to the disclosure for heating an optical element in an optical system.
Figure 2A:
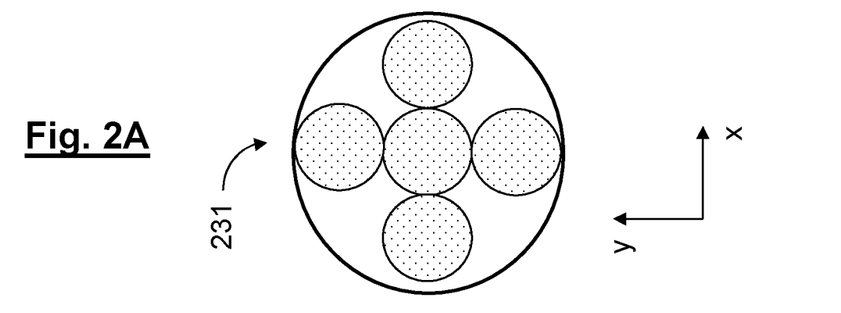
FIGS. 2A-2D show schematic illustrations for elucidating possible embodiments of a diffractive optical element used in a heating arrangement according to the disclosure.
Figure 2B:
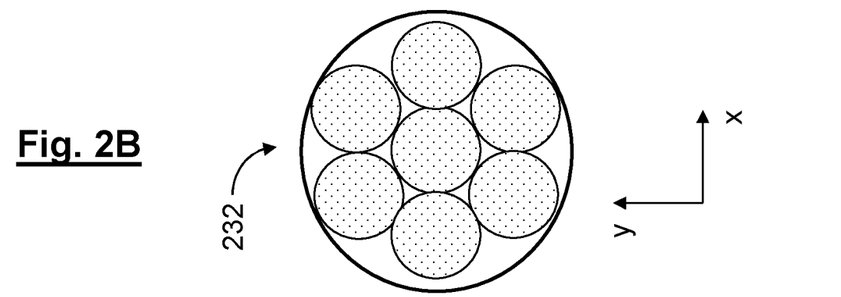
Figure 2C:
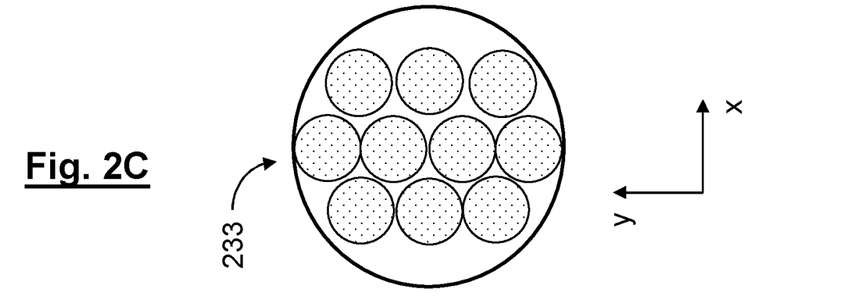
Figure 2D:
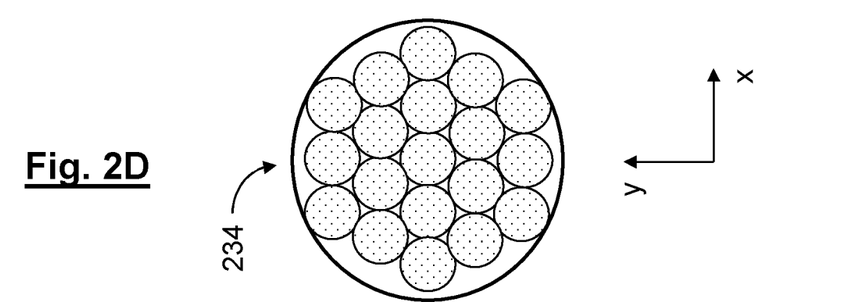

FIG. 1 shows a schematic illustration for elucidating the possible structure of an arrangement according to the disclosure for heating an optical element in a first embodiment.

According to FIG. 1, the heating arrangement according to the disclosure comprises a plurality of IR emitters 101, 102, 103, 104 for example, which may also be present in greater or smaller number. By way of example, the IR emitters 101, 102, 103, 104 can be embodied as IR lasers or as IR LEDs. According to FIG. 1, the IR radiation generated by the IR emitters 101-104 strikes a beam shaping unit denoted by "130" via a microlens array 120—optionally provided to generate a collimated beam path—and, from the beam shaping unit, the IR radiation strikes the optically effective surface of an optical element or mirror (not depicted in FIG. 1).

The beam shaping unit 130 comprises at least one microstructured element, for example at least one diffractive optical element (DOE) or at least one refractive optical element (ROE). The beam shaping unit 130 can comprise a plurality of beam shaping segments, with each of these beam shaping segments being assigned to one of the IR emitters 101-104 in each case. These beam shaping segments bring about both beam shaping and a beam deflection in respect of the IR radiation to be steered to the optically effective surface of the optical element to be heated and can, once again, be realized as different regions on one and the same microstructured element or DOE, as is depicted purely schematically in FIGS. 2A-2D for different embodiments of beam shaping units 231-234. In further embodiments, corresponding beam shaping segments may also be realized on separate microstructured elements or DOEs.

According to FIG. 1, the optical system further comprises a multi-fiber head 110 comprising a multi-fiber connector 115 for connecting optical fibers, IR radiation from a respective one of the IR emitters 101, 102, 103, 104 being suppliable by way of each of these optical fibers. According to FIG. 1, the microlens array 120 and the beam shaping unit 130 are also integrated in the multi-fiber head 110.

Inter alia, the embodiment with the multi-fiber head 110 is desirable because a comparatively simple adjustment is facilitated, with the observance of allowed mechanical tolerances in respect of the optical fibers used for the radiation input coupling being able to be ensured at the same time.

Figure 3:
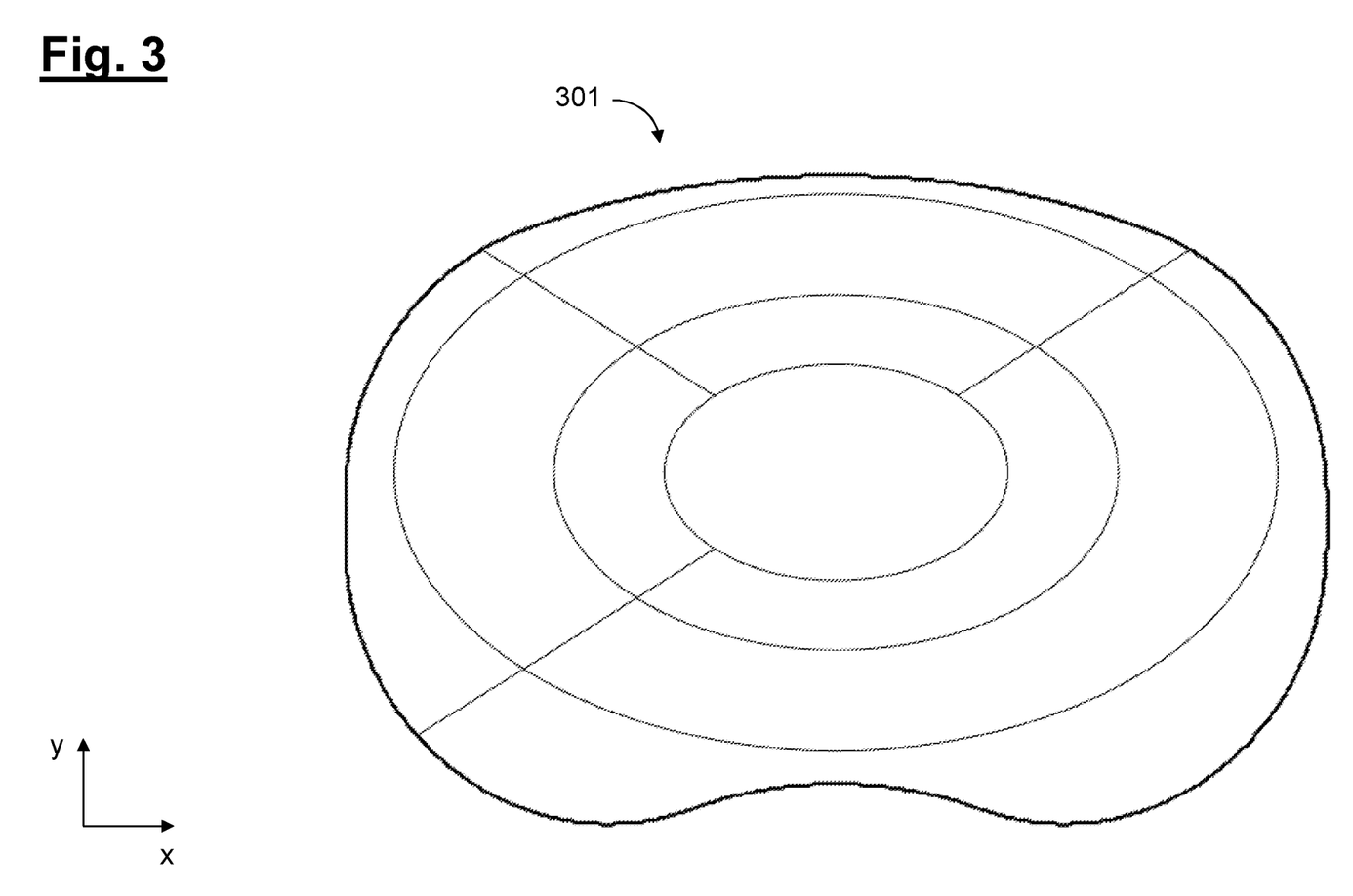
FIG. 3 shows a schematic illustration for elucidating possible heating profiles that are able to be set on the optically effective surface of an optical element using a heating arrangement according to the disclosure.

FIG. 3 shows a schematic illustration for elucidating possible heating profiles which are able to be generated on the respective optical element or mirror using the heating arrangement according to the disclosure of FIG. 1. In this case, one beam shaping segment in the beam shaping unit of the heating arrangement is in each case typically assigned to each of the segments of the relevant heating profile such that activating or deactivating the IR emitter assigned to the respective beam shaping segment defines whether or not the relevant heating segment is actively heated in the currently set heating profile.

Figure 4:
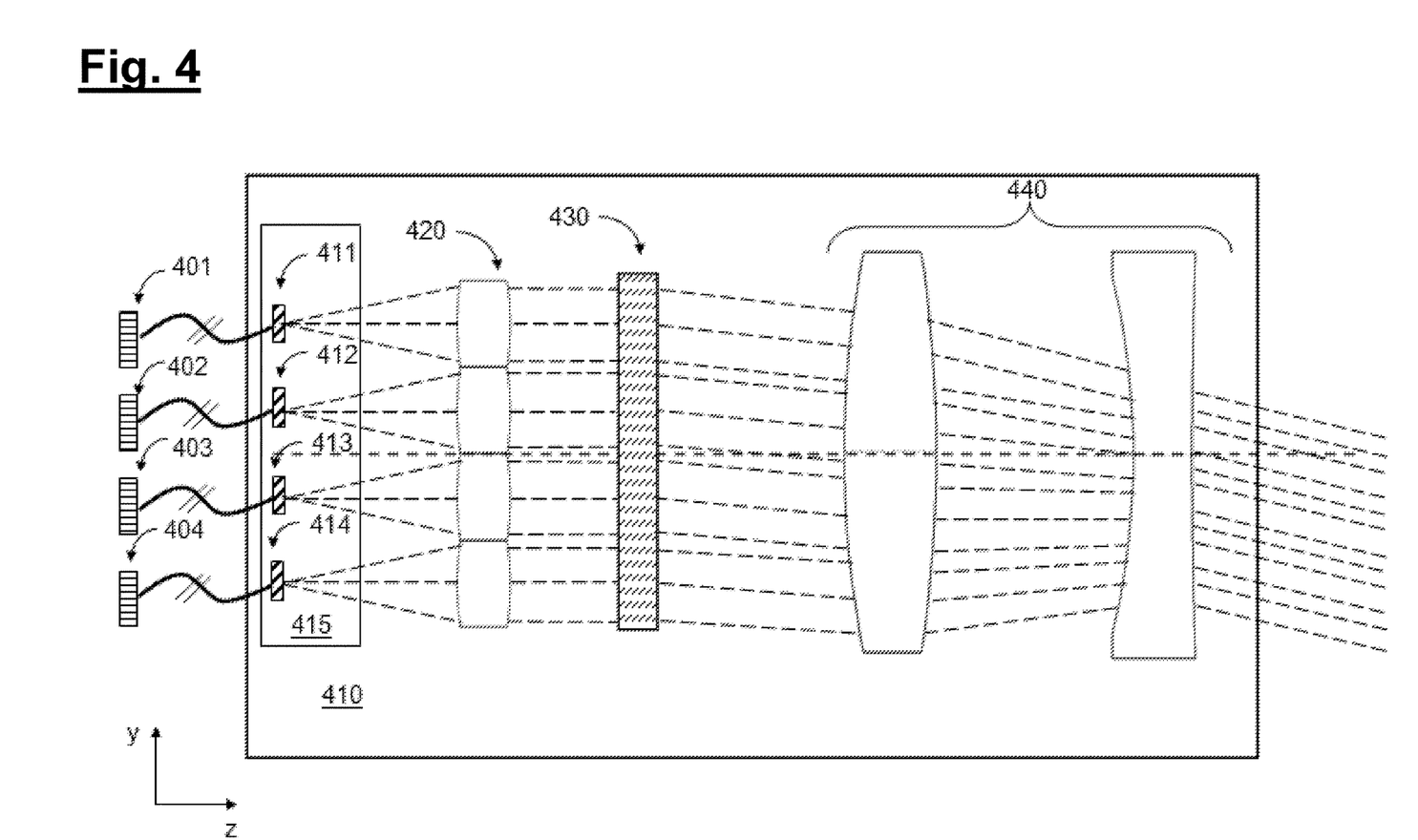
FIG. 4 shows a schematic illustration of the possible structure of a heating arrangement for heating an optical element in an optical system in a further embodiment.

FIG. 4 shows a schematic diagram for elucidating the structure of a heating arrangement according to the disclosure in a further embodiment, with components that are analogous or substantially functionally identical in comparison with FIG. 1 being designated by reference numerals increased by "300".

The heating arrangement according to FIG. 4 differs from that of FIG. 1 in that a beam deflection unit, for example in the form of an optical telescope 440 (a Galilean telescope in the exemplary embodiment), is additionally provided in the beam path downstream of the beam shaping unit 430 (whereas the entire beam deflection is provided by the beam shaping unit 130 according to FIG. 1). As indicated in FIG. 4, the effect of the beam deflection unit or optical telescope 440 is an increase in the deflection angles obtained overall by the heating arrangement, with the consequence that the beam shaping unit 430 is unburdened in this respect and can be restricted in terms of its optical effect to the region of relatively small deflection angles, for which a diffractive optical element (DOE), for instance, has a greater diffraction efficiency. In this case, the relevant deflection angle can typically be increased multiple times (e.g., by a factor of 5) by the additional effect of the beam deflection unit or telescope 440.

In embodiments, further provision can be made of a cooling unit for cooling the heating arrangement according to FIG. 1 or FIG. 4 (which possibly has high power densities).

Even though the disclosure has been described on the basis of specific embodiments, numerous variations and alternative embodiments will be apparent to a person skilled in the art, for example through combination and/or exchange of features of individual embodiments. Accordingly, it will be apparent to a person skilled in the art that such variations and alternative embodiments are also encompassed by the present disclosure, and the scope of the disclosure is restricted only within the scope of the appended patent claims and the equivalents thereof.

What is claimed is:

1. An optical system, comprising:
a mirror comprising an optically effective surface configured to operate at an operating wavelength of less than 30 nm;
a plurality of IR emitters configured to emit IR radiation;
a plurality of optical fibers;
a multi-fiber connector; and
a beam shaping unit,
wherein:
for each IR emitter, the IR emitter has a corresponding optical fiber so that IR radiation emitted by the IR emitter is coupled into its corresponding optical fiber;
the multi-fiber connector is connected to the optical fibers so that, for each IR emitter, the corresponding optical fiber supplies the IR radiation emitted by the IR emitter to the multi-fiber connector;
the beam shaping unit is configured to shape a beam of the IR radiation emitted by the multi-fiber connector onto the optically effective surface of the mirror; and
for each IR emitter, the IR emitter is activatable and deactivatable independently from the other IR emitters to variably set different heating profiles in the mirror.

2. The optical system of claim 1, wherein the beam shaping unit comprises a micro-structured element.

3. The optical system of claim 1, wherein the beam shaping unit comprises a diffractive optical element.

4. The optical system of claim 1, wherein the beam shaping unit comprises a refractive optical element.

5. The optical system of claim 1, wherein the beam shaping unit comprises a plurality of beam shaping segments configured to irradiate different segments of the optically effective surface of the mirror with IR radiation.

6. The optical system of claim 5, wherein, for each IR emitter, the IR emitter has a corresponding beam shaping segment so that IR radiation emitted by the IR emitter is coupled into its corresponding beam shaping segment.

7. The optical system of claim 6, wherein the beam deflection unit is integral with a multi-fiber head, and the multi-fiber head comprises the multi-fiber connector.

8. The optical system of claim 1, wherein the beam shaping unit is integral with the multi-fiber head.

9. The optical system of claim 1, further comprising a beam deflection unit between the beam shaping unit and the mirror along a path of the IR radiation through the optical system.

10. The optical system of claim 9, wherein the beam deflection unit comprises an optical telescope.

11. The optical system of claim 1, wherein a beam path through the optical system for radiation at the operating wavelength is different from a beam path of the IR radiation through the optical system.

12. The optical system of claim 1, wherein a beam path through the optical system for radiation at the operating wavelength is outside of a beam path of the IR radiation through the optical system.

13. The optical system of claim 1, further comprising a unit configured to cool the IR emitters.

14. The optical system of claim 1, wherein the operating wavelength is less than 15 nm.

15. A method, comprising:
emitting IR radiation from a plurality of IR emitters;
for each of a plurality of IR emitters, coupling IR radiation emitted by the IR emitter into an optical fiber;
for each optical fiber, coupling the IR radiation by its corresponding IR emitter into a multi-fiber connector;
emitting the radiation from the multi-fiber connector and onto a beam shaping unit;
emitting the radiation from the beam shaping unit and onto an optically effective surface of a mirror; and
for each IR emitter, activating and/or deactivating the IR emitter independently from the other IR emitters to variably set different heating profiles in the mirror.

16. The method of claim 15, further comprising selectively heating the mirror based on an illumination setting used in the optical system.

17. The method of claim 15, further comprising heating the mirror to reduce a spatial and/or temporal variation of a temperature distribution in the mirror.

18. The method of claim 15, wherein the mirror has an operating wavelength of less than 30 nm.

19. The method of claim 15, further comprising passing the IR radiation through a beam deflection unit between the beam shaping unit and the mirror, wherein the beam deflection unit comprises an optical telescope.

20. An optical system, comprising:
an optical element comprising an optically effective surface configured to operate at an operating wavelength of less than 30 nm;
a plurality of IR emitters configured to emit IR radiation;
a plurality of optical fibers;
a multi-fiber connector;
a beam shaping unit; and
a beam deflection unit between the beam shaping unit and the optical element along a path of the IR radiation through the optical system,
wherein:
the beam deflection unit comprises an optical telescope;
for each IR emitter, the IR emitter has a corresponding optical fiber so that IR radiation emitted by the IR emitter is coupled into its corresponding optical fiber;
the multi-fiber connector is connected to the optical fibers so that, for each IR emitter, the corresponding optical fiber supplies the IR radiation emitted by the IR emitter to the multi-fiber connector;
the beam shaping unit is configured to shape a beam of the IR radiation emitted by the multi-fiber connector onto the optically effective surface of the optical element; and
for each IR emitter, the IR emitter is activatable and deactivatable independently from the other IR emitters to variably set different heating profiles in the optical element.

* * * * *

UNITED STATES PATENT AND TRADEMARK OFFICE
CERTIFICATE OF CORRECTION

| | |
|---|---|
| PATENT NO. | : 12,085,780 B2 |
| APPLICATION NO. | : 17/805757 |
| DATED | : September 10, 2024 |
| INVENTOR(S) | : Andrea Berner et al. |

Page 1 of 1

It is certified that error appears in the above-identified patent and that said Letters Patent is hereby corrected as shown below:

In the Specification

Column 1, Line 58, please replace "$\partial = 30°$" with -- $\theta = 30°$ --.

Column 2, Line 34, please replace "is is" with -- is --.

Signed and Sealed this
Twenty-sixth Day of November, 2024

*Katherine Kelly Vidal*
Katherine Kelly Vidal
*Director of the United States Patent and Trademark Office*